(12) United States Patent
Kim

(10) Patent No.: US 9,923,191 B2
(45) Date of Patent: Mar. 20, 2018

(54) SECONDARY BATTERY AND THE DESIGN METHOD THEREOF

(71) Applicant: SK Innovation Co., Ltd., Seoul (KR)

(72) Inventor: Myung Hoon Kim, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 167 days.

(21) Appl. No.: 14/805,910

(22) Filed: Jul. 22, 2015

(65) Prior Publication Data

US 2016/0028062 A1 Jan. 28, 2016

(30) Foreign Application Priority Data

Jul. 24, 2014 (KR) .................... 10-2014-0093908

(51) Int. Cl.
| | |
|---|---|
| *H01M 4/131* | (2010.01) |
| *H01M 10/0585* | (2010.01) |
| *G06F 17/50* | (2006.01) |
| *H01M 4/505* | (2010.01) |
| *H01M 4/525* | (2010.01) |
| *H01M 10/052* | (2010.01) |

(52) U.S. Cl.
CPC ........ *H01M 4/131* (2013.01); *G06F 17/5009* (2013.01); *H01M 4/505* (2013.01); *H01M 4/525* (2013.01); *H01M 10/052* (2013.01); *H01M 10/0585* (2013.01)

(58) Field of Classification Search
CPC ............. H01M 10/0585; H01M 4/131; H01M 10/052; H01M 4/505; H01M 4/525; G06F 17/5009
See application file for complete search history.

(56) References Cited

U.S. PATENT DOCUMENTS

| | | | | |
|---|---|---|---|---|
| 2006/0251965 | A1* | 11/2006 | Nagayama | ............ H01M 2/021 429/209 |
| 2015/0024287 | A1* | 1/2015 | Duncan | ............ H01M 8/04731 429/403 |
| 2015/0030909 | A1* | 1/2015 | Ihlefeld | ............ H01M 10/0562 429/162 |
| 2016/0023567 | A1* | 1/2016 | Lee | ............ B60L 11/1861 320/136 |

FOREIGN PATENT DOCUMENTS

| | | |
|---|---|---|
| JP | 200827662 A | 2/2008 |
| KR | 1020070053614 A | 5/2007 |
| KR | 100894410 B1 | 4/2009 |

* cited by examiner

*Primary Examiner* — Mark F. Huff
*Assistant Examiner* — Monique M Wills
(74) *Attorney, Agent, or Firm* — The Webb Law Firm

(57) ABSTRACT

Provided is a design method of a secondary battery, including: calculating temperature profile per position of a battery in a stacked direction of a stack-type secondary battery in which cathodes and anodes are alternately stacked with separators interposed therebetween at the time of charging and discharging the stack-type secondary battery; and selecting cathode active materials used for cathodes per corresponding positions by the temperature profile per position.

6 Claims, 2 Drawing Sheets

FIG. 1a
FIG. 1b
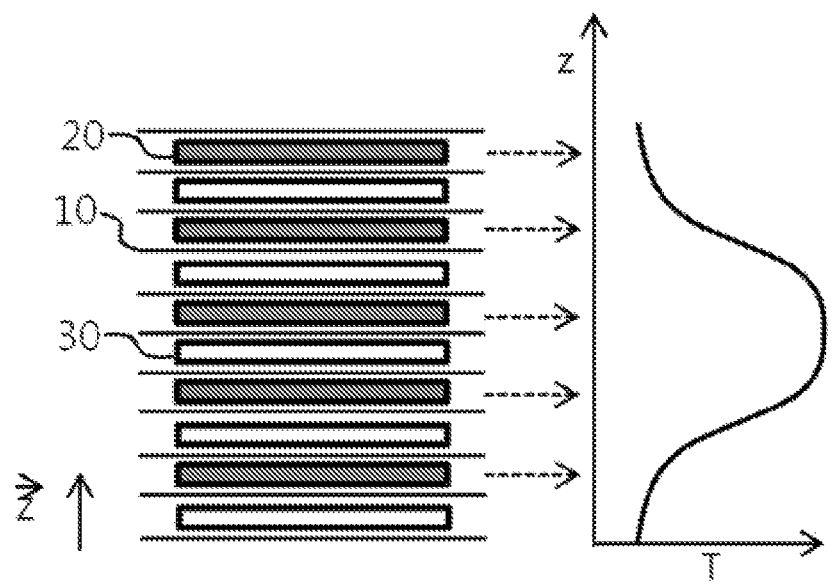
FIG. 2
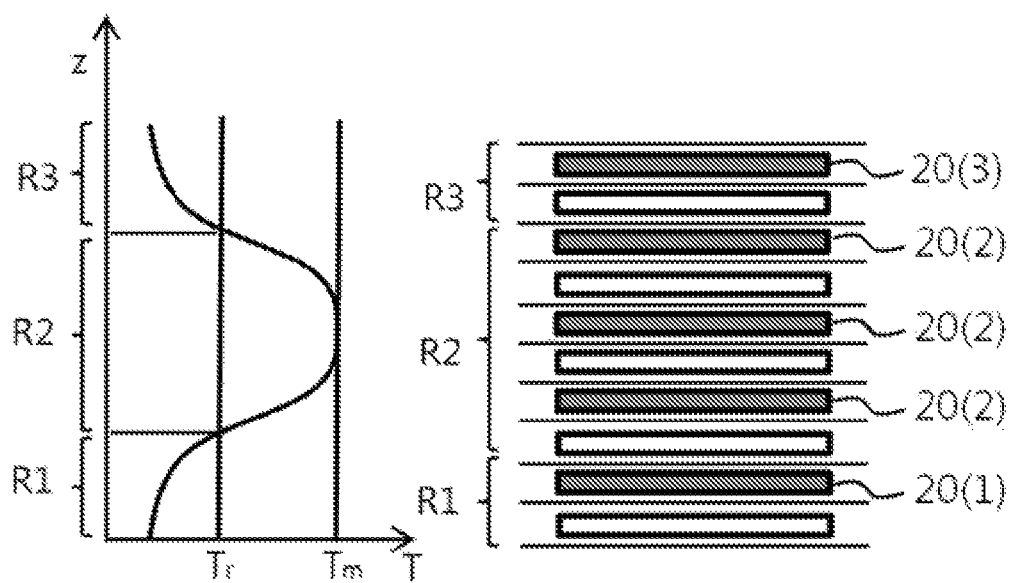

SECONDARY BATTERY AND THE DESIGN METHOD THEREOF

CROSS-REFERENCE TO RELATED APPLICATION

This application claims priority to Korean Patent Application No. 10-2014-0093908 filed Jul. 24, 2014, the disclosure of which is hereby incorporated in its entirety by reference.

TECHNICAL FIELD

The following disclosure relates to a secondary battery and a design method thereof, more specifically, to a secondary battery with improved stability and lifespan, and a design method thereof.

BACKGROUND

A battery is largely classified into a primary battery and a secondary battery, wherein the primary battery produces electricity by a non-reversible reaction, which is non-reusable after the battery is used once, and includes a largely used dry battery, a mercury battery, a voltaic battery, and the like, as examples; meanwhile, the secondary battery uses a reversible reaction unlike the primary battery, which is reusable by charging after being used, and includes a lead storage battery, a lithium ion battery, a nickel-cadmium (Ni—Cd) battery, and the like.

In general, the secondary battery includes a plurality of unit cells therein, and has a form in which a pair of external terminal tabs connected to electrodes of each cell (that is, tabs provided with a pair of one cathode, in which cathodes of each unit cell are connected, and one anode, in which anodes of each cell are connected for one battery to function as electrodes) are exposed to the outside. In particular, as described in Korean Patent Laid-Open Publication No. 2007-0053614, a stack-type lithium ion battery has a structure in which a plurality of anodes and cathodes immersed in an electrolyte are stacked with separators interposed therebetween and electrically connected to each other in series or in parallel. In the secondary batteries as described above, it is general that a plurality of anodes and cathodes are connected to each other to form one pack battery, rather than using a single anode and a single cathode.

As described above, the stack-type secondary battery in which a plurality of anodes and cathodes are stacked with separators interposed therebetween has a limitation in that the entire battery should be discarded even in a case in which only one film among the plurality of films (anodes, cathodes, and separators) configuring the battery is damaged or deteriorated.

RELATED ART DOCUMENT (Patent Document 1) Korean Patent Laid-Open Publication No. 2007-0053614

SUMMARY

An embodiment of the present invention is directed to providing a secondary battery capable of preventing deterioration of properties of the battery due to heat generation in the battery, and a design method thereof.

In one general aspect, a design method of a secondary battery, includes: a) calculating temperature profile per position of a battery in a stacked direction of a stack-type secondary battery in which cathodes and anodes are alternately stacked with separators interposed therebetween at the time of charging and discharging the stack-type secondary battery; and b) selecting cathode active materials used for cathodes per corresponding positions by the temperature profile per position.

In step b), the cathode active materials used for cathodes per corresponding positions may be selected according to the temperature profile per position, based on an upper limit value of a usage temperature per material of the cathode active materials.

Step b) may include selecting a material having an upper limit value of a usage temperature more than a temperature at each cathode position, on the temperature profile per position, based on the upper limit value of the usage temperature per material of the cathode active material, as a cathode active material of each cathode.

Step b) may include:

b1) determining at least one reference temperature which is a temperature between the minimum temperature and the maximum temperature in the temperature profile per position;

b2) selecting a low temperature active material group which are cathode active materials having a usage temperature more than the reference temperature, and selecting a high temperature active material group which are cathode active materials having a usage temperature more than the maximum temperature, based on an upper limit value of the usage temperature per material of the cathode active material;

b3) selecting the cathode active material included in the low temperature active material group, as a cathode active material of a cathode positioned in a temperature region below the reference temperature in the temperature profile per position; and b4) selecting the cathode active material included in the high temperature active material group, as a cathode active material of a cathode positioned in a temperature region of the reference temperature or more in the temperature profile per position.

The design method may further include:

c) determining a charge-discharge capacity of the secondary battery to be designed, before step b).

Step b) may include:

b5) selecting a material having an upper limit value of a usage temperature more than a temperature at each cathode position, on the temperature profile per position, based on the upper limit value of the usage temperature per material of the cathode active material, as a cathode active material candidate group of each cathode; and c6) selecting a cathode active material of each cathode from the cathode active material candidate group of each cathode so as to satisfy a charge-discharge capacity of the secondary battery to be designed at the time of connecting the stacked cathodes in parallel.

The secondary battery may be a lithium secondary battery.

In another general aspect, there is provided a secondary battery designed by the design method as described above.

In another general aspect, there is provided a stack-type secondary battery including cathodes; anodes; and separators, wherein the cathodes and anodes are alternately stacked with the separators interposed therebetween, and a cathode active material of the cathode positioned in the center based on a stacked direction is different from a cathode active material of the cathode positioned in an outermost part based on the stacked direction.

The secondary battery may have at least three divided regions including a first region including the cathode positioned in the lowermost part, a second region including the cathode positioned in the center, and a third region including the cathode positioned in the uppermost part, based on a stacked direction, the cathode positioned in the first region may be provided with a cathode active material as the same as that of the third region, and the cathode positioned in the second region may be provided with a cathode active material different from those of the cathodes of the first and third regions.

The secondary battery may have at least three divided regions including the first region including the cathode positioned in the lowermost part, the second region including the cathode positioned in the center, and the third region including the cathode positioned in the uppermost part, by at least one reference temperature which is a temperature between the minimum temperature and the maximum temperature in the temperature profile per position, based on the temperature profile per position in a stacked direction at the time of charging and discharging the battery.

The cathode active materials provided in the cathodes of the first and third regions may be different from that of the cathode of the second region.

The cathode active materials provided in the cathodes of the first region and the third region each independently may include a layered structure of lithium-nickel-cobalt-manganese composite oxide including lithium, nickel, cobalt and manganese as essential constituent elements.

The cathode active materials provided in the cathodes of the second region each independently may include a spinel-type lithium manganese oxide.

BRIEF DESCRIPTION OF THE DRAWINGS

FIGS. 1a and 1b show a design method of a secondary battery according to an exemplary embodiment of the present invention;

FIG. 2 shows a design method of the secondary battery according to another exemplary embodiment of the present invention and a secondary battery to be designed.

DETAILED DESCRIPTION OF EMBODIMENTS

Figure 3:
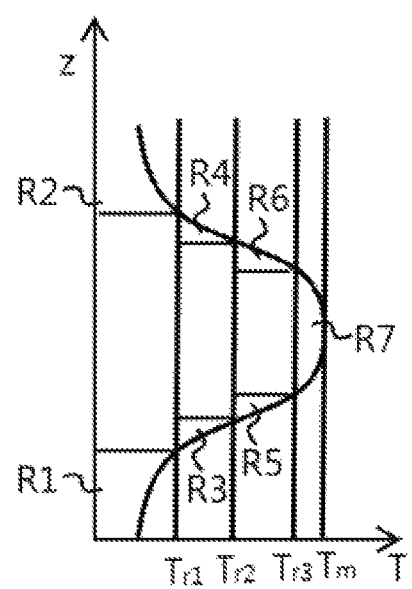
FIG. 3 shows a design method of the secondary battery according to another exemplary embodiment of the present invention.

Hereinafter, a secondary battery and a design method thereof of the present invention will be described in detail with reference to the accompanying drawings. The drawings of the present invention to be described below are provided by way of example so that the idea of the present invention can be sufficiently transferred to those skilled in the art to which the present invention pertains. Therefore, the present invention may be implemented in many different forms, without being limited to the drawings to be described below. The drawings may be exaggerated in order to specify the spirit of the present invention. Like reference numerals denote like elements throughout the specification.

Here, unless technical and scientific terms used herein are defined otherwise, they have meanings understood by those skilled in the art to which the present invention pertains. Known functions and components which obscure the gist of the present invention in the following description and the accompanying drawings will be omitted.

A design method of a secondary battery according to an exemplary embodiment of the present invention may include a) calculating temperature profile per position of a battery in a stacked direction of a stack-type secondary battery in which cathodes and anodes are alternately stacked with separators interposed therebetween at the time of charging and discharging the stack-type secondary battery; and b) selecting cathode active materials used for cathodes per corresponding positions by the temperature profile per position.

A surface temperature of an exterior material of the stack-type secondary battery is different from a temperature of an actual electrode (an anode or a cathode) inside the exterior material. In addition, as the number of stacked electrodes (anodes or cathodes) is increased, difference in temperature between the inside of the battery and the surface of the exterior material may also be increased, and in addition, a temperature change according to positions of the electrodes may be increased. In the design method of the secondary battery according to an exemplary embodiment of the present invention, cathodes for each position are designed based on the temperature profile per position of the battery, such that even though battery structures including a battery area, the number of stacked electrodes, and the like, are freely designed and changed, thermal stability of the battery may be guaranteed.

In addition, as described above, in the design method of the secondary battery according to an exemplary embodiment of the present invention, cathodes for each position may be designed based on the temperature profile per position of the battery to thereby prevent deterioration of properties of the battery due to heat of the cathodes vulnerable to heat, improve lifespan, prevent thermal runaway of the battery even in an over-charge state, and guarantee stability and lifespan of the battery even under an abnormal usage environment, that is, beyond the general categories.

In detail, a risk that the entire battery will be discarded due to partially damaged cathodes at the time of using the battery may be fundamentally prevented by selecting the cathodes which may be damaged by internal heat generation of the battery based on the temperature profile per position, and using cathode active materials having excellent thermal stability in the cathodes.

In the design method of the secondary battery according to an exemplary embodiment of the present invention, the secondary battery to be designed may include an electrode assembly in which a plurality of cathodes-separators-anodes are stacked; an electrolyte in which the electrode assembly is impregnated; a battery case in which the electrode assembly and the electrolyte are inserted and sealed, and respective cathodes configuring the electrode assembly may be connected to each other in parallel through a non-coated part, and respective anodes configuring the electrode assembly may be connected to each other in parallel through a non-coated part. In addition, the battery case may be provided with electrode terminals (battery tabs) connected to the cathodes and the anodes of the electrode assembly, respectively, to allow electric connection of external parts.

In the design method of the secondary battery according to an exemplary embodiment of the present invention, the cathodes and the anodes are alternately stacked to each other with the separators interposed therebetween in the electrode assembly, and the separators, the cathodes, or the anodes each independently may be positioned in each uppermost part and lowermost part of the electrode assembly. The number of cathodes stacked in the electrode assembly may be 3 to 100, specifically, 10 to 100, and the number of anodes may be 3 to 100, specifically, 10 to 100. As described above, the separators may be positioned between the cathodes and the anodes adjacent to each other, including the uppermost part and the lowermost part of the electrode assembly.

In the design method of the secondary battery according to an exemplary embodiment of the present invention, the temperature profile per position may indicate a temperature in a battery at each position, based on the stacked direction in which the cathodes and the anodes are alternately stacked, and one variable is a position information, and other one variable may be a two-dimensional information which is a temperature information at the corresponding position.

In detail, the temperature profile per position may be calculated by experiments or simulations, and when calculating the temperature profile per position, factors that may affect a battery temperature, such as usage environment, an overcharge voltage, a charge current, and the like, of the battery, may be controlled by predetermined conditions (battery driven environment), wherein the predetermined conditions may be a stability test condition defined in corresponding countries or defined by the standard or manufacturer. As one example, when calculating the temperature profile per position, the temperature profile per position may be calculated by conditions such as state of charge (SOC) from 0% to 100%, an overcharge target voltage of 4.2V or more, charge current of 0.1C or more, and the like.

As one specific example, the temperature profile per position may be temperature per position of the secondary battery in an overcharge state. That is, in the overcharge state of the stack-type secondary battery in which three or more of cathodes and anodes facing each other are stacked with separators interposed therebetween, the temperature profile per position of the battery in a stacked direction may be calculated. The overcharge state may indicate a state in which the battery is charged by 110% to 130% based on a rated charge voltage (V0) of the battery to be designed. For example, in a case of a lithium secondary battery, the overcharge state may indicate a state in which a charge voltage is over 4.2V.

As one non-limiting example for the calculation of the temperature profile per position, the temperature profile per position may be calculated by inserting a plurality of thermocouples into the stack-type secondary battery in a stacked direction or the temperature profile may be calculated by degree of damage of separators per position.

As one non-limiting example for the calculation of the temperature profile per position, the temperature profile per position may be calculated by simulation using mathematical modeling, and examples of the mathematical modeling include mathematical modelings of the stack-type batteries using electrode kinetics using Butler-Volmer equation, material conservation, charge conservation, heat conservation, heat-electrochemical coupling, and the like.

In detail, the stack-type secondary battery in which the temperature profile per position is calculated may include the electrode assembly in which a predetermined number of cathodes and anodes are alternately stacked with separators interposed therebetween in the battery case, and the cathodes, the anodes, and the separators, of the electrode assembly may be the same as each other, and the electrode assembly may be impregnated in the electrolyte. That is, a reference secondary battery which is the stack-type secondary battery in which the temperature profile per position is calculated may be a battery in which cathodes and anodes are stacked in corresponding numbers in a secondary battery to be designed, and anodes, separators, and an electrolyte used in the secondary battery to be designed may be provided, and the cathode may be formed as the same with generally used cathode active materials, under predetermined usage environment. Here, the number of stacked anodes and cathodes to be designed, the anode, the separator, and the electrolyte may be preset values and materials according to a battery capacity and use purposes, and the cathode may be any material as long as a charge-discharge reaction of the battery is possibly performed.

As described above, the design method of the secondary battery according to an exemplary embodiment of the present invention is directed to providing a design method of a stack-type secondary battery in which the plurality of cathodes and anodes are alternately stacked with the separators interposed therebetween, and the secondary battery, specifically, each cathode configuring the secondary battery may be designed based on the temperature profile per position of the battery showing temperatures of corresponding positions in the battery according to positions in a stacked direction during charge-discharge operation of the battery.

In detail, at the time of operating the secondary battery, in the electrode assembly, heat generated in the battery is transferred and emitted through an exterior angle to the outside of the battery, such that a temperature of the center of the battery may be higher than those of outermost parts of the battery.

In the design method of the secondary battery according to an exemplary embodiment of the present invention, the cathodes may be designed based on temperature deviation in the battery. In detail, cathode active materials provided in the cathodes may be designed according to positions, based on internal temperatures of the battery at positions of each cathode.

FIG. 1a shows one example of a cross-section of a secondary battery in which five cathodes 20 and five anodes 30 facing each other are stacked with the separators 10 interposed therebetween, and FIG. 1b shows one example of a calculated temperature profile per position. Here, a z direction in FIG. 1a indicates a stacked direction in which the cathodes and the anodes are stacked, and FIG. 1b indicates internal temperatures of the battery per position according to positions (z) in a stacked direction.

As shown in one example of FIG. 1, in the stack-type battery, heat is emitted through the lowermost part and the uppermost part to the outside of the battery, such that the center of the battery (electrode assembly) has the maximum temperature, and the outermost parts (the lowermost part and the uppermost part) of the battery (electrode assembly) have the minimum temperature.

In the design method of the secondary battery according to an exemplary embodiment of the present invention, the cathode active materials used in the cathodes per corresponding position may be selected based on the temperature profile per position as shown in one example of FIG. 1. That is, the cathode active materials used in the cathodes according to each position may be selected, based on the temperature profile per position.

In detail, the cathode active materials provided in each cathode having different temperatures on the temperature profile per position may be selected so as to be different from each other, based on the temperature profile per position.

In the design method of the secondary battery according to an exemplary embodiment of the present invention, when the cathode active material used in the cathode per corresponding position is selected according to the temperature profile per position, a basis of the selection may be an upper limit value of a usage temperature per material of the cathode active materials.

In detail, the cathode active materials known to be usable in the secondary battery are significantly various, and have different thermal stability for each cathode active material depending on its own properties of the cathode active materials.

In the design method of the secondary battery according to an exemplary embodiment of the present invention, the cathode active material at the upper limit value of the usage temperature per material of the cathode active material may be a material generally used as a cathode material of the secondary battery. As one example, the cathode active material may be lithium-transition metal oxide, and as one example, the cathode active material may be lithium-metal oxide selected from lithium-metal oxide in a layered structure, lithium-metal oxide in a spinel structure, and lithium-metal oxide in an olivine structure, or a solid solution of lithium-metal oxide containing two or more selected therefrom.

As one specific example, the lithium-metal oxide in a layered structure may include $LiMO_2$ represented by $LiCoO_2$ (M is one or two or more transition metal(s) selected from Co and Ni); $LiMO_2$ substituted with one or two or more heteroatom(s) selected from Mg, Al, Fe, Ni, Cr, Zr, Ce, Ti, B and Mn, or coated with oxides of the heteroatoms (M is one or two or more transition metal(s) selected from Co and Ni); or $Li_xNi_aMn_bCo_cMdO_2$ (x is a real number satisfying $0.9 \leq x \leq 1.1$, a is a real number satisfying $0.3 \leq a \leq 0.55$, b is a real number satisfying $0.3 \leq b \leq 0.4$, c is a real number satisfying $0.1 \leq c \leq 0.4$, a+b+c+d=1, and M is at least one element selected from the group consisting of Mg, Sr, Ti, Zr, V, Nb, Ta, Mo, W, B, Al, Fe, Cr and Ce).

As one specific example, the lithium-metal oxide in a spinel structure may include $Li_aMn_{2-x}M_xO_4$ (M is one or two or more element(s) selected from Al, Co, Ni, Cr, Fe, Zn, Mg, B and Ti, a is a real number satisfying $1 \leq a \leq 1.1$, x is a real number satisfying $0 \leq x \leq 0.2$) or $Li_4Mn_5O_{12}$.

As one specific example, the lithium-metal oxide in an olivine structure may include $LiMPO_4$. (M is Fe, Co, Mn).

In the design method of the secondary battery according to an exemplary embodiment of the present invention, the upper limit value of the usage temperature per material of the cathode active material may be a preset value by a designer, and may be a temperature at which structural collapse due to heat occurs (hereinafter, referred to as a structural collapse-occurring temperature), or a temperature obtained by subtracting a predetermined temperature value from the structural collapse-occurring temperature so as to design a more stable battery, by using material structural analysis or experiments, for each type of material. The structural collapse-occurring temperatures per cathode active material are physical property values which are previously known according to specific materials of the cathode active materials. That is, the structural collapse-occurring temperatures per cathode active material are values known in the art by experiments or reference documents. As one example, the structural collapse-occurring temperature of $LiCoO_2$ is 170° C., the structural collapse-occurring temperature of $LiMn_2O_4$ is 254° C., and the structural collapse-occurring temperature of $LiFePO_4$ is 245° C. In order to design a thermally stable battery, the upper limit value of the usage temperature per material may be a temperature lower than the structural collapse-occurring temperature of corresponding material by 20 to 50° C.

In the design method of the secondary battery according to an exemplary embodiment of the present invention, a material having the upper limit value of the usage temperature more than a temperature at each cathode position, on the temperature profile per position, based on the upper limit value of the usage temperature per material of the cathode active material may be selected as the cathode active material of each cathode. In detail, the temperature at each cathode position on the temperature profile per position may be a selection basis for the cathode active material of each cathode. As one example, when a temperature of a cathode positioned at N-th position (N is a natural number more than 1, that is, N>1) based on the lowermost part of the electrode assembly is T1, the cathode active material of the cathode positioned at N-th position may be one or two or more material(s) selected from materials in which the upper limit value of the usage temperature per material is more than T1.

As shown in one example of FIG. 2, the design method of the secondary battery according to an exemplary embodiment of the present invention may include: determining at least one reference temperature (Tr) which is a temperature between the minimum temperature and the maximum temperature in the temperature profile per position; selecting a low temperature active material group which are cathode active materials having a usage temperature more than the reference temperature (Tr), and selecting a high temperature active material group which are cathode active materials having a usage temperature more than the maximum temperature (TM), based on the upper limit value of the usage temperature per material of the cathode active material; selecting the cathode active material included in the low temperature active material group, as a cathode active material of a cathode positioned in a temperature region below the reference temperature (Tr) in the temperature profile per position; and selecting the cathode active material included in the high temperature active material group, as a cathode active material of a cathode positioned in a temperature region of the reference temperature (Tr) or more in the temperature profile per position.

One example of FIG. 2 shows a case in which one reference temperature (Tr) is determined, and shows a first region R1 which is a region from the lowermost part of the laminate to a position corresponding to the reference temperature (Tr), a third region R3 which is a region from the uppermost part of the laminate to a position corresponding to the reference temperature (Tr), and a second region R2 which is a region at a position corresponding to a temperature region between the reference temperature (Tr) and the maximum temperature (TM) on the temperature profile per position, divided by the single reference temperature (Tr).

In one example of FIG. 2, the cathode positioned in the first region is shown with the number of corresponding region in parentheses (1), together with a reference number thereof, the cathode positioned in the second region is also shown with the number of corresponding region in parentheses (2), together with a reference number thereof, and the cathode positioned in the third region is also shown with the number of corresponding region in parentheses (3), together with a reference number thereof.

As described above, in the design method of the secondary battery according to an exemplary embodiment of the present invention, the stacked cathodes may be divided per region by the reference temperature (Tr), and the cathode active materials of the cathodes included in each region may be selected based on the reference temperature (Tr) and/or the maximum temperature (TM) on the temperature profile per region.

In detail, the cathode active materials of the cathodes may be designed per divided region. Cathode active materials having an upper limit value of a usage temperature per material more than the reference temperature (Tr) may be selected as a low temperature active material group, that is, the cathode active materials having an upper limit value of a usage temperature per material more than the reference temperature (Tr) and having an upper limit value of a usage temperature per material of the maximum temperature (Tm) or less may be selected as the low temperature active material group, and cathode active materials having an upper limit value of a usage temperature per material more than the maximum temperature (Tm) may be selected as a high temperature active material group.

After the low temperature active material group and the high temperature active material group are selected by the reference temperature and the maximum temperature, the cathodes (20(1), 20(3)) included in the first region (R1) and the third region (R3) that are regions corresponding to the minimum temperature on the temperature profile per region to the reference temperature may be provided with one or two or more material(s) selected from the low temperature active material group as the cathode active materials. The cathode (20(2)) included in the second region (R2) which is a region corresponding to the maximum temperature on the temperature profile per position to the reference temperature may be provided with one or two or more material(s) selected from the high temperature active material group as the cathode active materials.

Here, even though the cathodes are included in the same region, the cathodes may contain different cathode active materials, and the cathode active materials are used as long as they are selected per region according to the upper limit value of the usage temperature per material based on the reference temperature and the maximum temperature.

In addition, although FIG. 2 shows an example in which the active material group capable of being used per region divided by the single reference temperature is selected, two or more reference temperatures may be determined.

As described above, heat emits through the lowermost part or the uppermost part of the battery to the outside of the battery, such that symmetrical temperature profile based on the center of the battery may be provided. Accordingly, when the number of reference temperatures different from each other is determined as L (L is a natural number satisfying L>1), there are divided 2L+1 regions, and in the divided regions, materials having the upper limit value of the usage temperature per material more than the reference temperature (higher temperature than two reference temperatures dividing the regions) which is a division basis of each region may be selected as an active material group used in the cathode of the corresponding region.

FIG. 3 shows one example showing each region of the battery (specifically, electrode assembly) divided in a direction in which the cathodes, the separators, and the anodes, in a case in which three different reference temperatures (Tr1~Tr3, Tr1<Tr2<Tr3<Tm) are determined. In detail, a stacked region of the battery may be divided into two regions (R1 and R2) corresponding to the minimum temperature on the temperature profile per position to Tr1, two regions (R3 and R4) corresponding to Tr1 to Tr2, and two regions (R5 and R6) corresponding to Tr2 to Tr3, and one region (R7) corresponding to Tr3 to the maximum temperature on the temperature profile per position, and the cathode(s) positioned in each divided region may be provided with the cathode active materials selected based on the upper limit value of the usage temperature per material, as described above.

In one example of FIG. 3, the cathode active materials having the upper limit value of the usage temperature per material more than Tr1, the cathode active materials having the upper limit value of the usage temperature per material more than Tr2, the cathode active materials having the upper limit value of the usage temperature per material more than Tr3, and the cathode active materials having the upper limit value of the usage temperature per material more than Tm may be selected. Here, the cathode active materials having the upper limit value of the usage temperature per material more than Tm are used in all of R1 to R7, and the cathode active materials having the upper limit value of the usage temperature per material more than Tr3 are used in all of R1 to R6, the cathode active materials having the upper limit value of the usage temperature per material more than Tr2 are used in all of R1 to R4, and the cathode active materials having the upper limit value of the usage temperature per material more than Tr1 are used in all of R1 to R2.

As described above, the cathode active materials having a higher upper limit value of the usage temperature per material may be commonly used in at least one region, and the cathode active materials provided in the cathodes positioned in each region may be selected by considering battery capacity together with economic and environmental aspects and easiness of supply. That is, after regions are divided by the reference temperature, the cathode active materials usable for each division according to the upper limit value of the usage temperature per material are selected, the cathode active materials used in the cathodes positioned in each region may be selected (secondary selection) from materials satisfying the above-described thermal condition (the division of regions by the reference temperature and the upper limit value of the usage temperature per material more than the reference temperature dividing corresponding region), by considering cost, environment, easiness of manufacture, easiness of supply of raw materials, and battery capacity. Among them, the battery capacity may function as the most important basis of the secondary selection.

The design method according to an exemplary embodiment of the present invention may further include determining a charge-discharge capacity of the secondary battery to be designed, and the cathode active materials of each cathode may be selected by the charge-discharge capacity determined together with the temperature profile per position.

In detail, the determining of the charge-discharge capacity may include selecting a material having the upper limit value of the usage temperature more than temperature at each cathode position, on the temperature profile per position, based on the upper limit value of the usage temperature per material of the cathode active material, as a cathode active material candidate group of each cathode; and selecting a cathode active material of each cathode from the cathode active material candidate group of each cathode so as to satisfy a charge-discharge capacity of the secondary battery to be designed at the time of connecting the stacked cathodes in parallel.

The cathode active materials known to be usable in the secondary battery are significantly various, and each cathode active material has theoretical or experimental capacity limit by its own property.

In the design method of the secondary battery according to an exemplary embodiment of the present invention, in a step of selecting a cathode active material from the cathode active material candidate group, capacity per material of the cathode active material may be a preset value by a designer, and may be capacity of each cathode active material known in the art by experiments or reference documents.

As described above, in the design method of the secondary battery according to an exemplary embodiment of the present invention, the cathode active material candidate group usable in the cathodes at each position may be selected by the temperature profile per position, and the cathode active materials used in each cathode may be selected from each cathode active material candidate group so as to satisfy the preset battery capacity.

Accordingly, deterioration of properties of the battery due to heat may be prevented, lifespan may be improved, thermal runaway of the battery may be prevented, stability and lifespan of the battery may be guaranteed, and the battery capacity may be freely designed so as to be appropriate for applications.

In the design method of the secondary battery according to an exemplary embodiment of the present invention, a secondary battery which is a design target may be a lithium secondary battery. The lithium secondary battery may be a lithium ion battery or a lithium polymer battery.

In the design method of the secondary battery according to an exemplary embodiment of the present invention, in view of a physical shape of the battery, the secondary battery to be designed may be a secondary battery having a jelly roll type electrode assembly, and may be a pouch typed secondary battery in which the jelly roll type electrode assembly and the electrolyte are sealed in a pouch.

In the design method of the secondary battery according to an exemplary embodiment of the present invention, at the time of designing the secondary battery, the temperature profile per position, the upper limit value of the usage temperature per material of the cathode active material, charge-discharge capacity per material of the cathode active material, charge-discharge capacity of the battery to be designed, the reference temperature based on the temperature profile per position, and the like, used as basic information on design, may be input by a designer by general input devices, and may be stored in general memory devices. The design (including selection of materials, and the like) may be performed by a design unit in which a program of selecting the cathode active materials provided in each cathode is operated by general microprocessors by the above-described design method, while being interconnected with the memory devices.

In addition, together with the upper limit value of the usage temperature per material of the cathode active material, additional reference information capable of being additionally usable in selecting materials of the cathodes, such as cost and/or capacity per material of the cathode active material, and the like, may be stored together in the memory devices, and the cathode active materials usable in the cathodes per position are primarily selected by the upper limit value of the usage temperature per material of the cathode active material, and secondarily selected by the additional reference information. Here, as described above, a basis of the secondary selection may be a battery capacity to be designed, and cost (cost for manufacturing the secondary battery) together with the battery capacity may be a basis of the secondary selection.

Independently, the design unit may print out materials selected as the cathode active materials on the cathodes for each position, through general output units such as a display device or a printer. Based on the output results, a designer may select the cathode active material to be finally used, among materials usable as the cathode active materials in the cathodes for each position, in consideration of cost for manufacturing the battery, easiness of supply of raw material (active material), environmental effect of the raw material (active material), battery capacity to be designed, and the like. However, it means that when there are a plurality of materials selected as the cathode active materials of each cathode from the results calculated from the design devices, a designer merely select a more preferred case from the calculated results in consideration of cost, effect on the environment, and the like, and it is regarded that any material selected as the cathode active material of corresponding cathode may be usable as the cathode active material of the corresponding cathode.

The present invention provides a secondary battery designed by the design method as described above.

The secondary battery according to an exemplary embodiment of the present invention may be a stack-type secondary battery in which cathodes and anodes are alternately stacked with the separators interposed therebetween, and the cathode active material of the cathode positioned in the center based on a stacked direction may be different from the cathode active material of the cathode positioned in an outermost part based on the stacked direction.

At the time of charging and discharging the stack-type secondary battery, internal heat generation may occur, and heat sink is a surface of the battery, such that a temperature of the center of the battery may be relatively higher than that of the outermost part thereof. Even though the deterioration of properties of the battery due to heat generation of the battery is considered, the temperature of the battery is considered by a temperature sensor measuring temperatures around the battery case, such that when a secondary battery is manufactured only by considering battery capacity and surface temperature of the battery, the cathode active materials may be deteriorated in the center of the battery which has a relatively higher temperature, and affects all properties of the battery.

However, in the secondary battery according to an exemplary embodiment of the present invention, the cathode active materials of the cathodes positioned in the center of the battery may be different from the cathode active materials of the cathodes positioned in the outermost part of the battery, to thereby prevent deterioration due to temperature non-uniformity in the battery, improve lifespan, prevent thermal runaway of the battery even in an over-charge state, and guarantee stability and lifespan of the battery even under the usage environment beyond general categories.

Here, as heat emits through the lowermost part or the uppermost part of the battery (electrode assembly), the temperature profile per position of the battery based on the stack direction of the cathodes or the anodes may be symmetrical based on the center of the battery (electrode assembly).

The secondary battery according to an exemplary embodiment of the present invention may include at least three divided regions including the first region including the cathode positioned in the lowermost part, the second region including the cathode positioned in the center, and the third region including the cathode positioned in the uppermost part, based on a stacked direction, the cathode positioned in the first region may be provided with the cathode active material as the same as that of the third region, and the cathode positioned in the second region may be provided with a cathode active material different from those of the cathodes of the first and third regions.

When more specifically described the secondary battery divided into at least first to third regions according to an exemplary embodiment of the present invention, the first to third regions may be divided based on the temperature profile per position in the stacked direction at the time of charging and discharging the battery, and specifically, may be divided by at least one reference temperature which is a temperature between the minimum temperature and the maximum temperature in the temperature profile per position.

More specifically, the battery (electrode assembly) may be divided into the first region including the cathode positioned in the lowermost part, the second region including the cathode positioned in the center, and the third region including the cathode positioned in the uppermost part by considering non-uniformity of temperatures per position of the battery and the symmetrical temperature profile per position as described above, and the first and third regions may be regions of the battery (electrode assembly) having a temperature between the minimum temperature on the temperature profile per position and the reference temperature, and the second region may be a region of the battery (electrode assembly) having a temperature between the reference temperature and the maximum temperature on the temperature profile per position.

That is, the secondary battery according to an exemplary embodiment of the present invention may be divided into regions provided with different cathode active materials in order to prevent deterioration of properties due to temperature non-uniformity in the battery, and the cathode active materials of the cathodes in at least two regions based on the divided regions may be different from each other. In detail, at the time of charging and discharging the battery, the secondary battery may be a secondary battery designed based on the temperature profile per position, and the temperature profile per position has a symmetrical temperature change in which the center of the battery has the highest temperature, and the temperature is reduced as being far from the center of the battery, such that the battery may be divided into at least three regions including the first, second, and third regions, as described above, and the cathodes positioned in the second region may contain cathode active materials different from those of the cathodes of the first and third regions. More specifically, the second region including the cathode positioned in the center of the battery may be provided with the cathode containing the cathode active materials capable of preventing thermal deterioration (thermal structural collapse, and the like) of the cathode active materials.

The temperature profile per position which is a basis of region division may be calculated by experiments or simulations, and when calculating the temperature profile per position, factors that may affect a battery temperature, such as usage environment, an (over)charge voltage, a charge current, and the like, of the battery, may be controlled by predetermined conditions (battery driven environment), wherein the predetermined conditions may be a stability test condition defined in corresponding countries or defined by the standard or manufacturer, and may be a condition corresponding to extreme conditions such as an overcharge state.

The secondary battery according to an exemplary embodiment of the present invention may be a lithium secondary battery, and the lithium secondary battery may be a lithium ion secondary battery or a lithium polymer secondary battery.

Based on the lithium secondary battery, the first region and the third region may be regions corresponding to the minimum temperature on the temperature profile per position to the reference temperature, and the second region may be a region corresponding to the reference temperature to the maximum temperature.

In the secondary battery according to an exemplary embodiment of the present invention, the cathodes active materials provided in the cathodes of the first region and the third region each independently may include a layered structure of lithium-nickel-cobalt-manganese composite oxide including lithium, nickel, cobalt and manganese as essential constituent elements.

In the secondary battery according to an exemplary embodiment of the present invention, the lithium-nickel-cobalt-manganese composite oxide may be a material satisfying Chemical Formula 1 below:

$$L_xNi_aMn_bCo_cM_dO_2 \quad \text{(Chemical Formula 1)}$$

in Chemical Formula 1, x is a real number of 0.9 to 1.1, a is a real number of 0.3 to 0.55, b is a real number of 0.3 to 0.4, c is a real number of 0.1 to 0.4, a+b+c+d=1, and M is at least one element selected from the group consisting of Mg, Sr, Ti, Zr, V, Nb, Ta, Mo, W, B, Al, Fe, Cr and Ce.

The material represented by Chemical Formula 1 is a ternary-based (Ni—Mn—Co) cathode active material for a lithium secondary battery, which is one of the high capacity materials capable of implementing a high capacity battery. However, among various cathode active materials, the material represented by Chemical Formula 1 has relatively deteriorated thermal stability, such that cathodes containing the material represented by Chemical Formula 1 may be provided in the first and third regions in order to implement capacity of the battery to be designed, prevent thermal deterioration of the battery, and improve lifespan. Here, the reference temperature which is a basis of the regions provided with the cathodes including the material represented by Chemical Formula 1 (the first and third regions) may be 130 to 150° C., and the first and third regions that are regions below the reference temperature may be provided with the cathodes containing the material represented by Chemical Formula 1 as the cathode active materials.

In the secondary battery according to an exemplary embodiment of the present invention, the cathode active materials provided in the cathodes of the second region each independently may include a spinel-type lithium manganese oxide.

In the secondary battery according to an exemplary embodiment of the present invention, the spinel-type lithium manganese oxide may be a material satisfying Chemical Formula 2 below:

$$Li_yMn_{2-e}MeO_4 \quad \text{(Chemical Formula 2)}$$

in Chemical Formula 2, y is a real number of 1 to 1.1, e is a real number of 0 to 0.2, and, M is at least one element selected from the group consisting of Al, Co, Ni, Cr, Fe, Zn, Mg, B and Ti.

The material represented by Chemical Formula 2 is a cathode active material for a lithium secondary battery, and has relatively excellent thermal stability among various cathode active materials, and as one example, $LiMn_2O_4$ is a material having the structural collapse-occurring temperature at 254° C., that means, has significantly high thermal stability.

In the secondary battery according to an exemplary embodiment of the present invention, the cathode positioned in the third region may contain a spinel-type lithium manganese oxide as the cathode active material, and specifically, may contain the spinel-type lithium manganese oxide satisfying Chemical Formula 2.

The secondary battery according to an exemplary embodiment of the present invention may include an electrode assembly in which cathodes and anodes facing each other are alternately stacked with separators interposed therebetween; an electrolyte impregnated in the electrode assembly; and a battery case sealing the electrode assembly and the electrolyte.

Respective cathodes of the electrode assembly may be connected to each other in series or in parallel or in serial-parallel, and respective anodes thereof may also be connected to each other in series or in parallel or in serial-parallel. Here, the cathode may include a current collector and a cathode active material layer containing a cathode active material on the current collector, and the cathode may include a non-coated part in which the cathode active material layer is not formed on the current collector. The anode may also include a current collector and an anode active material layer containing an anode active material on the current collector, and the anode may include a non-coated part in which the anode active material layer is not formed on the current collector. Electrical connection between the respective cathodes or between the respective anodes of the electrode assembly may be achieved through the non-coated parts.

The current collectors of each cathode and/or each anode in the electrode assembly may be porous conductors, and more specifically, the current collectors may have a shape of a foam, a film, a mesh, a felt, or a perforated film made of conductive materials. More specifically, the current collector may be a conductive material having excellent conductivity and including graphite, graphene, titanium, copper, platinum, aluminum, nickel, silver, gold, or carbon nanotube that are chemically stable at the time of charging and discharging the battery, and may have a shape of a foam, a film, a mesh, a felt, or a perforated film made of conductive materials, and may be a complex coated or stacked with different conductive materials.

The anode active material of each anode in the electrode assembly may be usable as long as it is an active material generally used in the anode of the secondary battery. As one example of the lithium secondary battery, the anode active material is used as long as it is a material capable of performing lithium intercalation. As one non-limiting example based on the lithium secondary battery, the anode active material may be at least one material selected from soft carbon, hard carbon, graphite, silicon, Sn alloy, Si alloy, Sn oxide, Si oxide and lithium-titanium oxide.

In the electrode assembly, the separators positioned between the cathodes and the anodes adjacent to each other may be different from each other or the same as each other per position according to a stacked direction of the cathodes and the anodes, and are used as long as they are separators generally used in order to prevent short-circuit of the anodes and the cathodes in the general secondary battery. As one non-limiting example based on the lithium secondary battery, the separators may be at least one material selected from polyethylene-based materials, polypropylene-based materials, and polyolefin-based materials, and may have a microporous film structure. In addition, the separator may have a stacked structure in which a plurality of organic films such as polyethylene films, polypropylene films, and nonwoven fabric, and the like, are stacked to prevent over-current, maintain the electrolyte, and improve physical strength.

The above-described electrode assembly may be manufactured by a method for manufacturing a general jelly roll typed electrode assembly, and as one example, the electrode assembly may be formed by rolling a plurality of cathodes and anodes that are spaced apart from each other while being disposed alternately to each other, on one surface of the separator. However, the present invention is not limited by the above-described method for manufacturing the electrode assembly.

The electrolyte impregnated in the electrode assembly is used as long as it is a general aqueous or non-aqueous electrolyte which smoothly conducts ions involved in charge and discharge of the battery in a general secondary battery. As one non-limiting example based on a lithium secondary battery, the electrolyte may be a non-aqueous electrolyte, and the non-aqueous electrolyte may include a non-aqueous solvent and a lithium salt. As one non-limiting example, the lithium salt contained in the electrolyte may be a salt providing a lithium cation and at least one anion selected from the group consisting of $NO_3^-$, $N(CN)_2^-$, $BF_4^-$, $ClO_4^-$, $PF_6^-$, $(CF_3)_2PF_4^-$, $(CF_3)_3PF_3^-$, $(CF_3)_4PF_2^-$, $(CF_3)_5PF$, $(CF_3)_6P^-$, $CF_3SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$, and $(CF_3CF_2SO_2)_2N^-$. The solvent of the electrolyte may be at least one solvent selected from the group consisting of ethylene carbonate, propylene carbonate, 1,2-butylene carbonate, 2,3-butylene carbonate, 1,2-pentylene carbonate, 2,3-pentylene carbonate, vinylene carbonate, dimethyl carbonate, diethyl carbonate, di(2,2,2-trifluoroethyl)carbonate, dipropyl carbonate, dibutyl carbonate, ethylmethyl carbonate, 2,2,2-trifluoroethyl methyl carbonate, methylpropyl carbonate, ethylpropyl carbonate, 2,2,2-trifluoroethyl propyl carbonate, methyl formate, ethyl formate, propyl formate, butyl formate, diethyl ether, diethyl ether, dipropyl ether, methylethyl ether, methylpropyl ether, ethylpropyl ether, methyl acetate, ethyl acetate, propyl acetate, butyl acetate, meth propionate, ethyl propionate, propyl propionate, butyl propionate, methyl butyrate, ethyl butyrate, propyl butyrate, butyl butyrate, γ-butyrolactone, 2-methyl-γ-butyrolactone, 3-methyl γ-butyrolactone, 4-methyl-γ-butyrolactone, γ-thiobutyrolactone, γ-ethyl-γ-butyrolactone, β-methyl-γ-butyrolactone, γ-valerolactone, σ-valerolactone, γ-caprolactone, ε-caprolactone, β-propiolactone, tetrahydrofuran, 2-methyl tetrahydrofuran, 3-methyl tetrahydrofuran, trimethyl phosphate, triethyl phosphate, tris(2-chloroethyl)phosphate, tris(2,2,2-trifluoroethyl)phosphate, tripropyl phosphate, triisopropryl phosphate, tributyl phosphate, trihexyl phosphate, triphenyl phosphate, tritolyl phosphate, methyl ethylene phosphate, ethyl ethylene phosphate, dimethyl sulfone, ethyl methyl sulfone, methyl trifluoromethyl sulfone, ethyl trifluoromethyl sulfone, methyl pentafluoroethyl sulfone, ethyl pentafluoroethyl sulfone, di(trifluoromethyl)sulfone, di(pentafluoroethyl) sulfone, trifluoromethyl pentafluoroethyl sulfone, trifluoromethyl nonafluorobutyl sulfone, pentafluoroethyl nonafluorobutyl sulfone, sulfolane, 3-methylsulfolane, 2-methylsulfolane, 3-ethylsulfolane, and 2-ethylsulfolane.

Here, the separator may include a separator generally used in the secondary battery in order to prevent a short-circuit between the anode and the cathode in the secondary battery, and may support the electrolyte. One example of the separator may be a microporous film including polyethylene, polypropylene, and polyolefin, and may have a stacked structure in which a plurality of organic films such as polyethylene films, polypropylene films, and nonwoven fabric, and the like, are stacked to prevent over-current, maintain the electrolyte, and improve physical strength.

In the design method of the secondary battery according to the present invention, respective cathodes may be designed based on temperature profile per position of the battery, to thereby prevent deterioration of properties of the battery due to heat, improve lifespan, prevent thermal runaway of the battery even in an over-charge state, and guarantee stability and lifespan of the battery even under the usage environment beyond general categories.

In the secondary battery according to the present invention, a cathode active material of a cathode positioned in the center of the battery may be different from cathode active materials of cathodes positioned in outermost parts of the battery, to thereby prevent deterioration due to temperature non-uniformity in the battery, improve lifespan, prevent thermal runaway of the battery even in an over-charge state, and guarantee stability and lifespan of the battery even under the usage environment beyond general categories.

Hereinabove, although the present invention is described by specific matters, limited exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope and spirit of the invention.

What is claimed is:

1. A stack-type secondary battery comprising:
   cathodes; anodes; and separators,
   wherein the cathodes and anodes are alternately stacked with the separators interposed therebetween,
   wherein a cathode active material of the cathode positioned in the center based on a stacked direction is different from a cathode active material of the cathode positioned in an outermost part, based on the stacked direction, and
   wherein the secondary battery has at least three divided regions including the first region including the cathode positioned in the lowermost part, the second region including the cathode positioned in the center, and the third region including the cathode positioned in the uppermost part, by at least one reference temperature which is a temperature between the minimum temperature and the maximum temperature in the temperature profile per position, based on the temperature profile per position in a stacked direction at the time of charging and discharging the battery.

2. The stack-type secondary battery of claim 1, wherein the cathode active materials provided in the cathodes of the first and third regions are different from that of the cathode of the second region.

3. The stack-type secondary battery of claim 1, wherein the cathode active materials provided in the cathodes of the first region and the third region each independently include a layered structure of lithium-nickel-cobalt-manganese composite oxide including lithium, nickel, cobalt and manganese as essential constituent elements.

4. The stack-type secondary battery of claim 3, wherein the cathode active materials provided in the cathodes of the second region each independently include a spinel-type lithium manganese oxide.

5. The stack-type secondary battery of claim 1, wherein
   the secondary battery has at least three divided regions including a first region including the cathode positioned in the lowermost part, a second region including the cathode positioned in the center, and a third region including the cathode positioned in the uppermost part, based on a stacked direction,
   the cathode positioned in the first region is provided with a cathode active material as the same as that of the third region, and
   the cathode positioned in the second region is provided with a cathode active material different from those of the cathodes of the first and third regions.

6. The stack-type secondary battery of claim 5, wherein the cathode active materials provided in the cathodes of the first region and the third region each independently include a layered structure of lithium-nickel-cobalt-manganese composite oxide including lithium, nickel, cobalt and manganese as essential constituent elements.

* * * * *